United States Patent
Jin et al.

(10) Patent No.: US 11,063,184 B2
(45) Date of Patent: Jul. 13, 2021

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Chao Jin, Xiamen (CN); Chuang Yu Hsieh, Xiamen (CN); Chen Kang Hsieh, Xiamen (CN); Duxiang Wang, Xiamen (CN); Chaoyu Wu, Xiamen (CN); Chih Pang Ma, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 16/137,525

(22) Filed: Sep. 20, 2018

(65) Prior Publication Data

US 2019/0027652 A1 Jan. 24, 2019

Related U.S. Application Data

(63) Continuation of application No. PCT/CN2016/111670, filed on Dec. 23, 2016.

(30) Foreign Application Priority Data

Apr. 27, 2016 (CN) .......................... 201610267719.0

(51) Int. Cl.
*H01L 33/38* (2010.01)
*C23C 28/00* (2006.01)
(Continued)

(52) U.S. Cl.
CPC ............ *H01L 33/387* (2013.01); *C23C 14/14* (2013.01); *C23C 14/24* (2013.01); *C23C 14/58* (2013.01);
(Continued)

(58) Field of Classification Search
CPC ... H01L 33/387; H01L 25/0753; H01L 33/06; H01L 33/12; H01L 33/145; H01L 33/30;
(Continued)

(56) References Cited

U.S. PATENT DOCUMENTS

2003/0102484 A1* 6/2003 Hata ..................... H01L 24/05
257/99
2005/0001222 A1* 1/2005 Kurahashi ............ H01L 33/105
257/94
(Continued)

FOREIGN PATENT DOCUMENTS

CN 104638078 A 5/2015

OTHER PUBLICATIONS

English Machine Translation of Chinese Patent Publication No. CN104638078 (Year: 2015).*
English Machine Translation of CN203812901 (Year: 2014).*

*Primary Examiner* — Dzung Tran
(74) *Attorney, Agent, or Firm* — Syncoda LLC; Feng Ma

(57) ABSTRACT

A light-emitting diode includes: a light emitting epitaxial structure including a first-type semiconductor layer, an active layer and a second-type semiconductor layer, and having a first surface as a light emitting surface, and an opposing second surface; a conducting layer formed over the second surface and including a physical plating layer and a chemical plating layer, wherein the physical plating layer is adjacent to the light emitting epitaxial structure and has cracks, and the chemical plating layer fills the cracks in the physical plating layer; and a submount coupled to the light
(Continued)

emitting epitaxial laminated layer through the conducting layer.

20 Claims, 11 Drawing Sheets

(51) Int. Cl.

| | |
|---|---|
| *C23C 18/16* | (2006.01) |
| *C23C 14/58* | (2006.01) |
| *C23C 14/14* | (2006.01) |
| *C23C 14/24* | (2006.01) |
| *C23C 18/31* | (2006.01) |
| *C23C 28/02* | (2006.01) |
| *H01L 25/075* | (2006.01) |
| *H01L 33/06* | (2010.01) |
| *H01L 33/12* | (2010.01) |
| *H01L 33/14* | (2010.01) |
| *H01L 33/30* | (2010.01) |
| *H01L 33/32* | (2010.01) |
| *H01L 33/44* | (2010.01) |
| *H01L 33/62* | (2010.01) |

(52) U.S. Cl.
CPC ............ *C23C 18/165* (2013.01); *C23C 18/31* (2013.01); *C23C 28/02* (2013.01); *C23C 28/30* (2013.01); *C23C 28/32* (2013.01); *C23C 28/34* (2013.01); *H01L 25/0753* (2013.01); *H01L 33/06* (2013.01); *H01L 33/12* (2013.01); *H01L 33/145* (2013.01); *H01L 33/30* (2013.01); *H01L 33/32* (2013.01); *H01L 33/44* (2013.01); *H01L 33/62* (2013.01); *H01L 2933/0016* (2013.01); *H01L 2933/0025* (2013.01); *H01L 2933/0066* (2013.01)

(58) Field of Classification Search
CPC ......... H01L 33/32; H01L 33/44; H01L 33/62; H01L 2933/0016; H01L 2933/0025; H01L 2933/0066; C23C 14/14; C23C 14/24; C23C 14/58; C23C 18/165; C23C 18/31; C23C 28/02; C23C 28/30; C23C 28/32; C23C 28/34
USPC .......................................................... 257/13
See application file for complete search history.

(56) References Cited

U.S. PATENT DOCUMENTS

| | | | | |
|---|---|---|---|---|
| 2005/0088080 | A1* | 4/2005 | Cheng | H01L 51/5092 313/504 |
| 2008/0197764 | A1* | 8/2008 | Bechtel | H01L 51/5268 313/499 |
| 2008/0218068 | A1* | 9/2008 | Cok | H05B 33/145 313/505 |
| 2008/0305631 | A1* | 12/2008 | Hirao | H01L 33/38 438/680 |
| 2010/0123153 | A1* | 5/2010 | Lin | H01L 33/42 257/98 |
| 2010/0213485 | A1* | 8/2010 | McKenzie | H01L 33/20 257/98 |
| 2013/0292736 | A1* | 11/2013 | Eberhard | H01L 33/42 257/100 |

* cited by examiner

LIGHT EMITTING DIODE AND FABRICATION METHOD THEREOF

CROSS-REFERENCE TO RELATED APPLICATIONS

The present application is a continuation of, and claims priority to, PCT/CN2016/111670 filed on Dec. 23, 2016, which claims priority to Chinese Patent Application No. 201610267719.0 filed on Apr. 27, 2016. The disclosures of these applications are hereby incorporated by reference in their entirety.

BACKGROUND

Light-emitting diode (LEDs) have been widely used due to their small size, low power consumption, long service life and energy saving. With the maturity of epitaxial growth technology of the metal organic chemical vapor deposition (MOCVD), LEDs with $(Al_xGa1_{-x})_{0.5}In_{0.5}P$ materials as active region have higher internal quantum efficiency, and the focus of research on LEDs is to improve the light extraction efficiency of the device via structure design.

Referring to FIG. 1, a light-emitting diode 100 using a transfer submount includes, in order from bottom to top, a conductive submount 110, a conducting layer 120, a light emitting epitaxial laminated layer 130 composed of a p-type semiconductor layer 131 and an n-type semiconductor layer 132, and an Ohm contacting layer 140 and electrodes 141, 142. The conducting layer 120 may include the material layers such as metal reflective layer and bonding alloy, and a hole structure 121 may further be arranged inside.

At present, vacuum evaporation method is mainly employed in LED metal/alloy evaporation, in which under high vacuum conditions, the materials to be evaporated are heated by electric resistance or electron beam to reach a melting temperature to cause atomic evaporation and then the material attached to the surface of the submount. However, the vacuum evaporation is non-isotropic and can only be deposited vertically upwards.

Therefore, when the conducting layer 120 is vacuum-deposited, a gap 122 appears at the edge of the vapor-deposited material, as shown in FIG. 2, causing the current expansion area to become small and affecting VF and ESD status.

SUMMARY

Various embodiments of the present disclosure provide a light-emitting diode and a method for fabricating the same, in which a conducting layer is formed by vacuum evaporation and chemical plating, and then the cracks formed in the vacuum evaporation process are filled with a metal to increase current conducting area, reduce voltage and improve ESD performance.

In an aspect, a light-emitting diode is provided including: a light emitting epitaxial structure including a first-type semiconductor layer, an active layer and a second-type semiconductor layer, and having a first surface as a light emitting surface, and an opposing second surface; a conducting layer formed over the second surface and including a physical plating layer and a chemical plating layer, wherein the physical plating layer is adjacent to the light emitting epitaxial structure and has cracks, and the chemical plating layer fills the cracks in the physical plating layer; and a submount coupled to the light emitting epitaxial laminated layer through the conducting layer.

The present disclosure also provides a fabrication method for light-emitting diode, comprising: 1) providing a light emitting epitaxial structure including a first-type semiconductor layer, an active layer and a second-type semiconductor layer, having a first surface as a light emitting surface and a second surface opposing to the first surface; 2) forming a conducting layer at the second surface of the light emitting epitaxial structure; 3) providing a submount and coupling the submount to the light emitting epitaxial structure through the conducting layer; wherein the forming the conducting layer comprises: forming a physical plating layer at the second surface of the light emitting epitaxial structure by metal evaporation, with cracks therein; depositing a metal material at the physical plating layer by chemical plating to form a chemical plating layer and fill the cracks in the physical plating layer.

In some embodiments, a transparent insulating layer is arranged between the conducting layer and the light emitting epitaxial laminated layer and has a series of conductive through-holes, and the physical plating layer fills the conductive through-holes.

In some embodiments, the surface of the side of the physical plating layer far from the light emitting epitaxial laminated layer has a height difference, thereby after the connection to the submount, forming a series of holes on the positions corresponding to the conductive through-holes, and serves as a current blocking layer.

In some embodiments, the cracks are formed on the edge position of the physical plating layer close to the conductive through-holes.

In some embodiments, the thickness of the chemical plating layer is 0.3~5 µm.

In some embodiments, prior to Step 2), a transparent insulating layer is first formed on the second surface of the light emitting epitaxial laminated layer and has a series of conductive through-holes filled by the physical plating layer.

In another aspect, a light-emitting system is provided including a plurality of light-emitting diodes (LEDs) described above. The light-emitting system can be used for lighting, display, signage, etc.

The other features and advantages of this present disclosure will be described in detail in the following specification, and it is believed that such features and advantages will become more obvious in the specification or through implementations of various embodiments of the present disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, rather than being drawn to scale.

DETAILED DESCRIPTION

Figure 1:
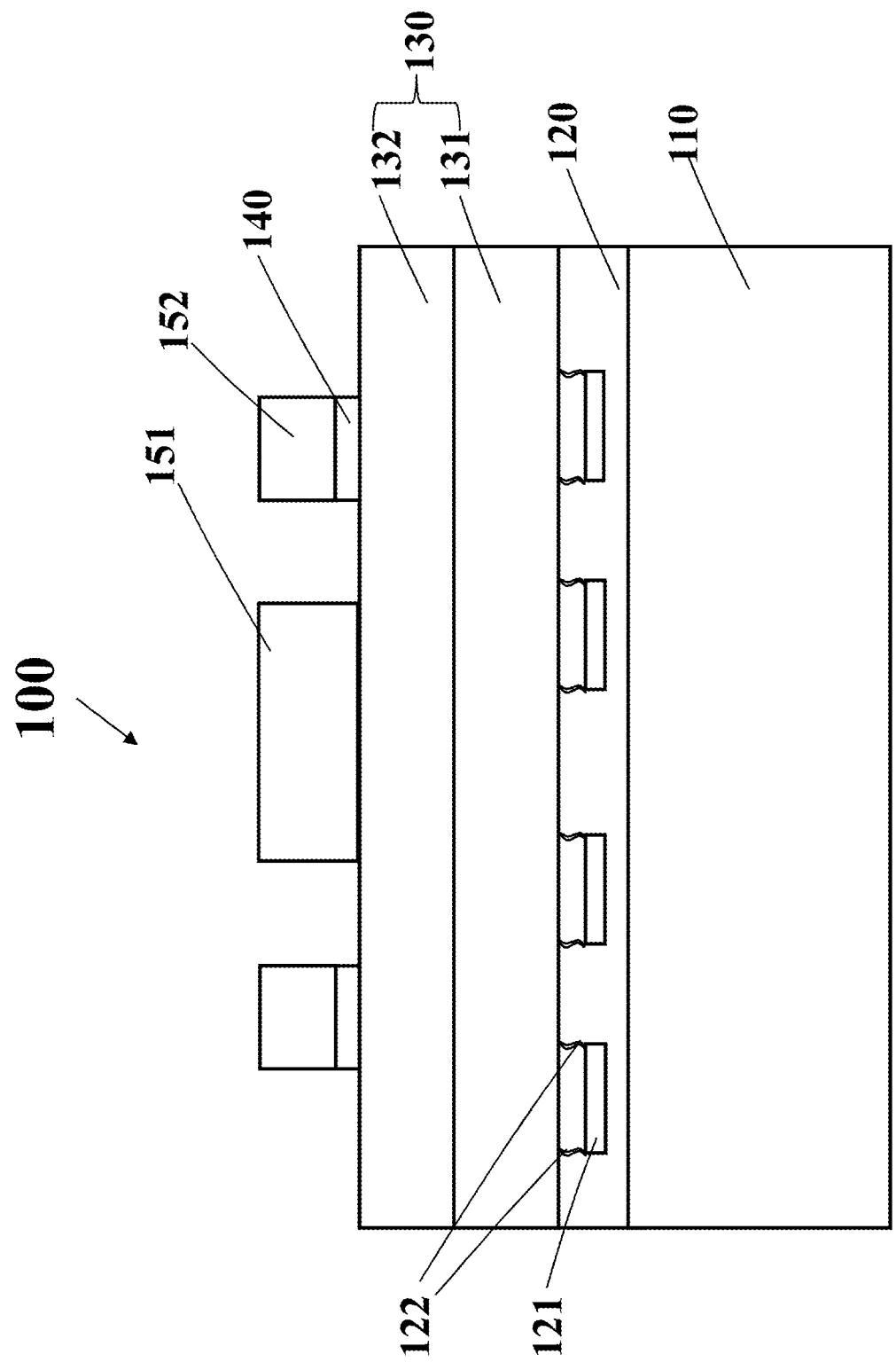
FIG. 1 is a sectional structural view of an existing light-emitting diode.
Figure 2:
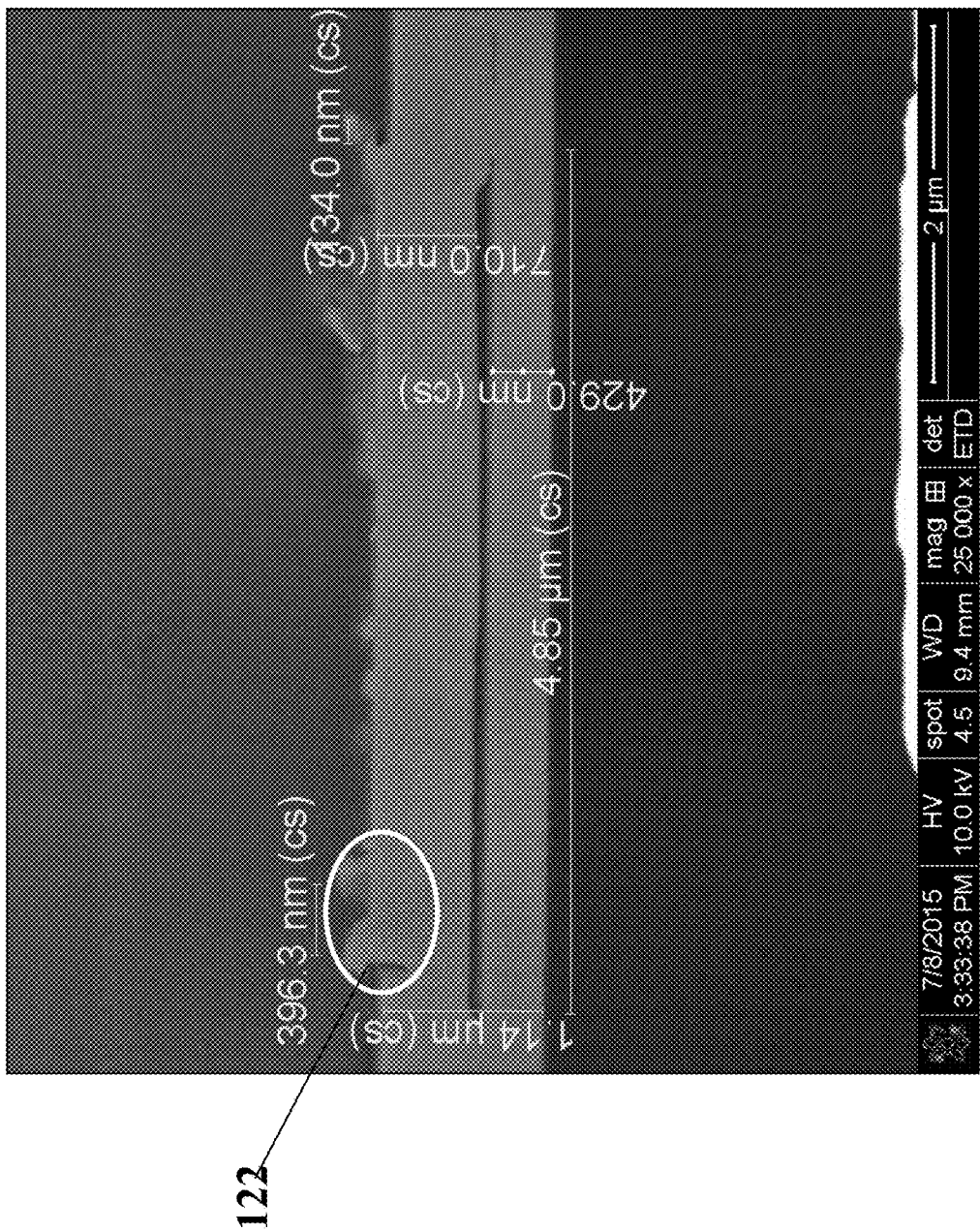
FIG. 2 is an SEM photograph of the light-emitting diode shown in FIG. 1.
Figure 3:
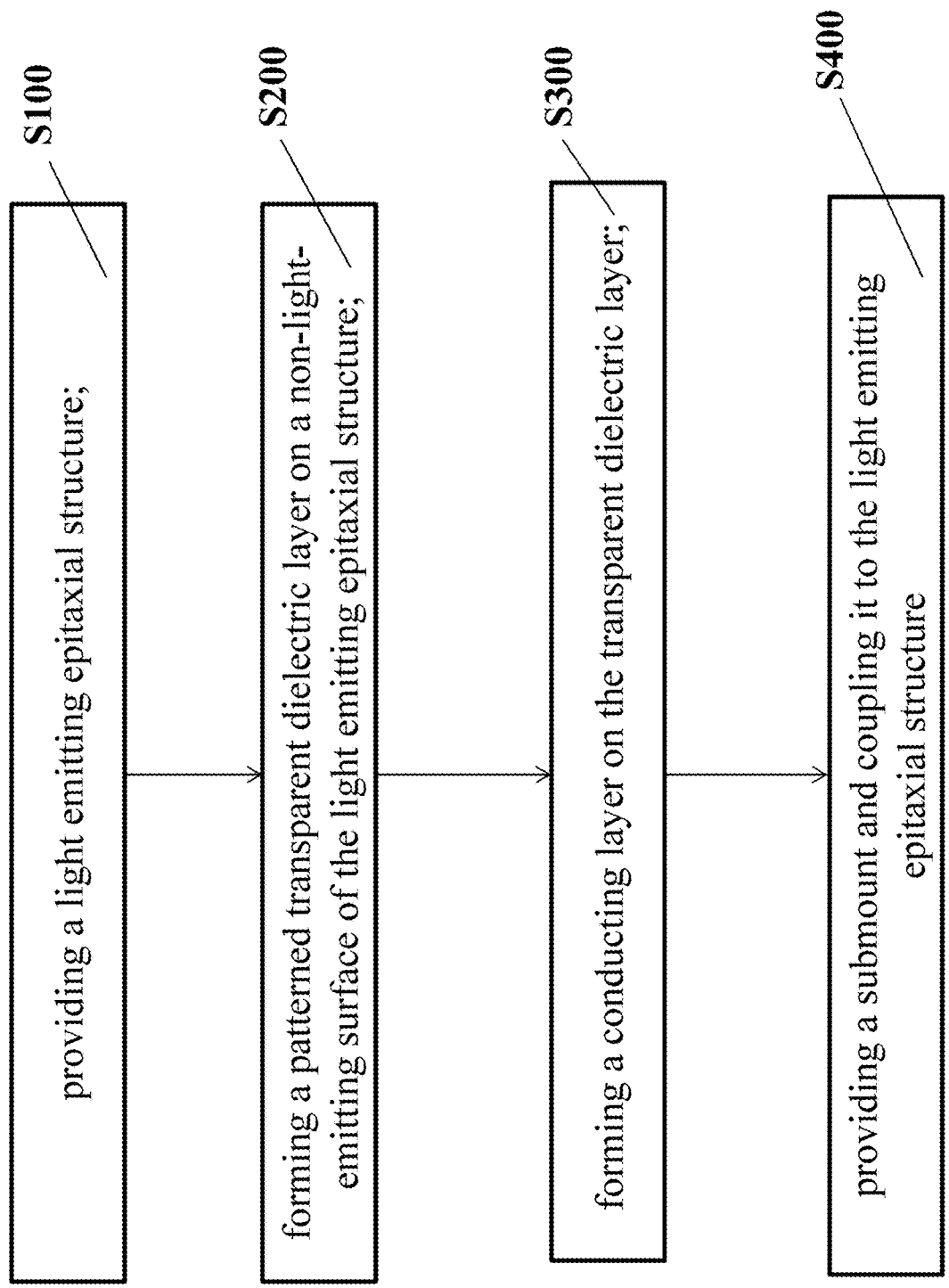
FIG. 3 is a flowchart of the fabrication method of the light-emitting diode implemented according to some embodiments of the present disclosure.
Figure 4:
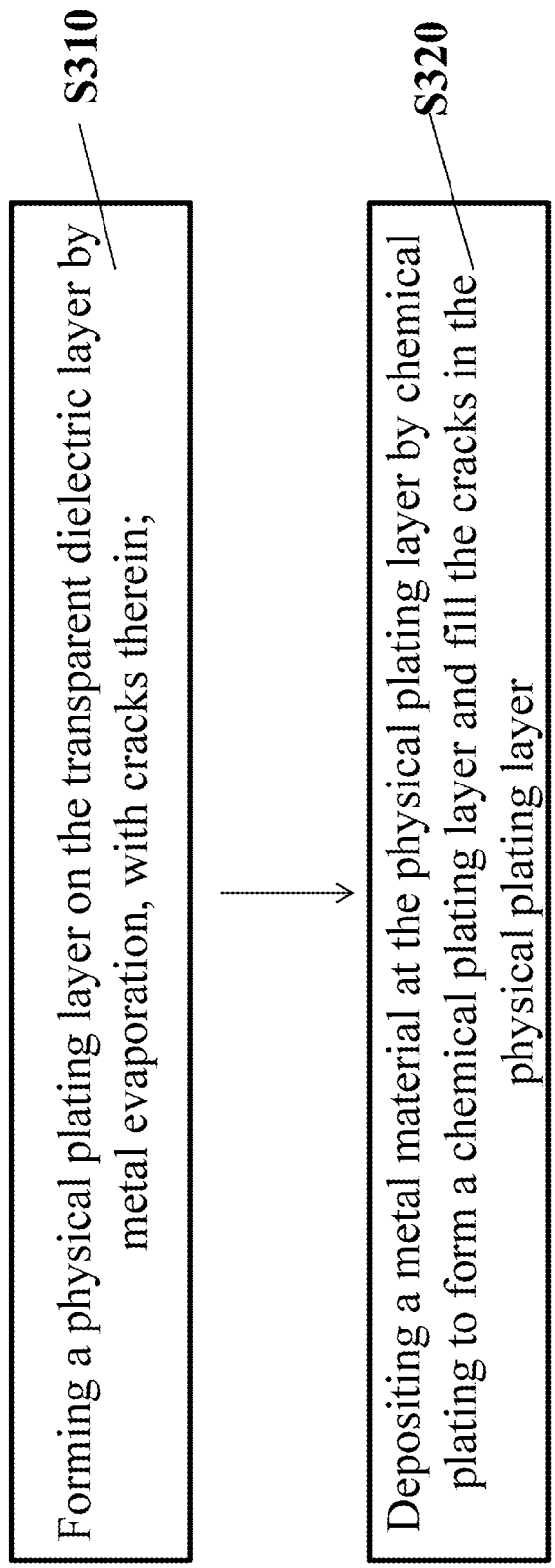
FIG. 4 is a flowchart of the fabrication method of the light-emitting diode implemented according to some embodiments of the present disclosure.

The embodiments of the present disclosure will be described in detail with reference to the accompanying drawings and examples The embodiments below disclose the fabrication method of a light-emitting diode, in which a conducting layer is formed on the bottom surface of the light emitting epitaxial laminated layer by vacuum evaporation and chemical plating, and further the cracks in the edge of the physical plating materials are filled with a metal to increase current conducting area, reduce voltage and improve ESD performance. With reference to FIGS. 3 and 4, the flow of forming the conducting layer by combined vacuum evaporation and chemical plating is described below.

Figure 5:
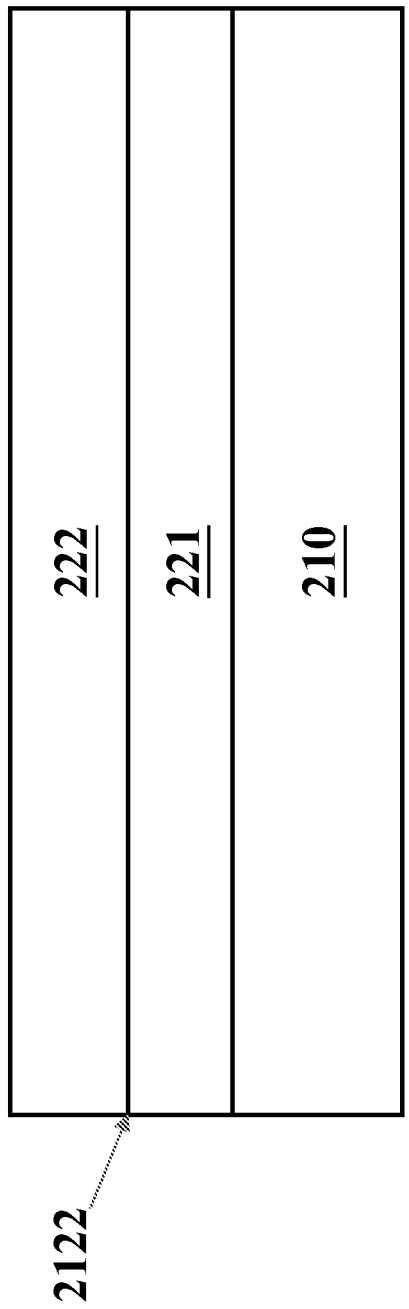
FIG. 5 illustrates a first step of fabricating the LED according to some embodiments of the present disclosure.

First, in Step S100, providing a light emitting epitaxial laminated structure at least comprising a submount 210, a first type semiconductor layer 221, a second type semiconductor layer 222 and an active layer between the first type semiconductor layer 221 and the second type semiconductor layer 222, as shown in FIG. 5. The materials of the submount 210 includes, but is not limited to, sapphire, aluminum nitride, gallium nitride, silicon, silicon carbide and gallium arsenide, and the surface structure thereof may be a planar structure or a patterned structure.

If the first type semiconductor layer 221 is a p-type semiconductor, the second type semiconductor layer 222 may be an anisotropic n-type semiconductor, and conversely, if the first type semiconductor layer 221 is an n-type semiconductor, the second type semiconductor layer 222 may be an anisotropic p-type semiconductor. The active layer is a neutral, p-type or n-type semiconductor. When an electric current is applied through the semiconductor light emitting laminated layer, the active layer 2122 is excited to emit light.

If the active layer 2122 is a nitride-based material, blue or green light is emitted; if an aluminum indium gallium phosphide-based material is used, light in amber colors such as red, orange and yellow is emitted. In the present embodiment, the first type semiconductor layer 221 is an n-type semiconductor, the second type semiconductor layer 222 is a p-type semiconductor, and the active layer is an aluminum indium gallium phosphide-based multiple quantum well structure.

Further, a first semiconductor buffer layer is arranged between the first type semiconductor layer 221 and the active layer, and a second semiconductor buffer layer is arranged between the active layer and the second type semiconductor layer 222. Specifically, the first type semiconductor layer 221 is a Si-doped AlGaInP material layer having a Si concentration of $7\times10^{17}$ to $1\times10^{18}$, and the second type semiconductor layer 222 is a Mg-doped GaP material layer having a doping concentration of above $1.5\times10^{18}$, and the first and second semiconductor buffer layers are both $(Al_{0.7}Ga_{0.3})$ InP material layers.

In some other embodiments, the active layer is made of a nitride material, and a superlattice stress buffer layer may be arranged between the first type semiconductor layer 221 and the active layer, and an electron blocking layer arranged between the active layer and the second type semiconductor layer 222.

Figure 6:
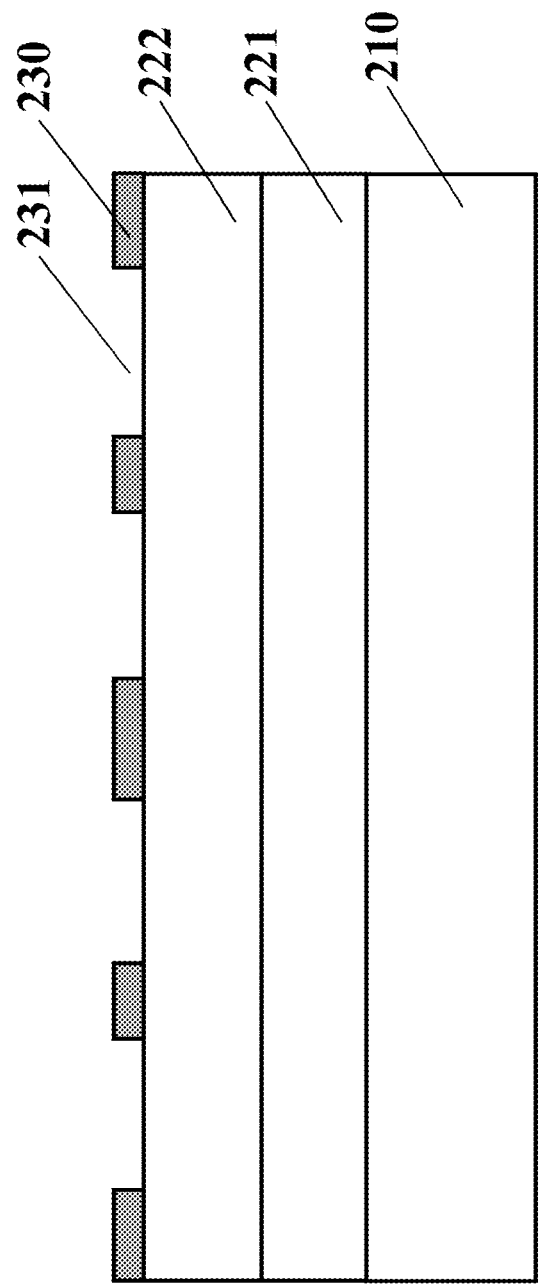
FIG. 6 illustrates a second step of fabricating the LED according to some embodiments of the present disclosure.

Next, in Step S200, forming a patterned transparent dielectric layer 230 on the surface of the second type semiconductor layer 222, as shown in FIG. 6. A portion of the surface of the second type semiconductor layer 222 is extruded in the transparent dielectric layer 230 as a conductive through-hole 231. The transparent dielectric layer may be made of $SiO_2$ or $SiN_x$.

Figure 7:
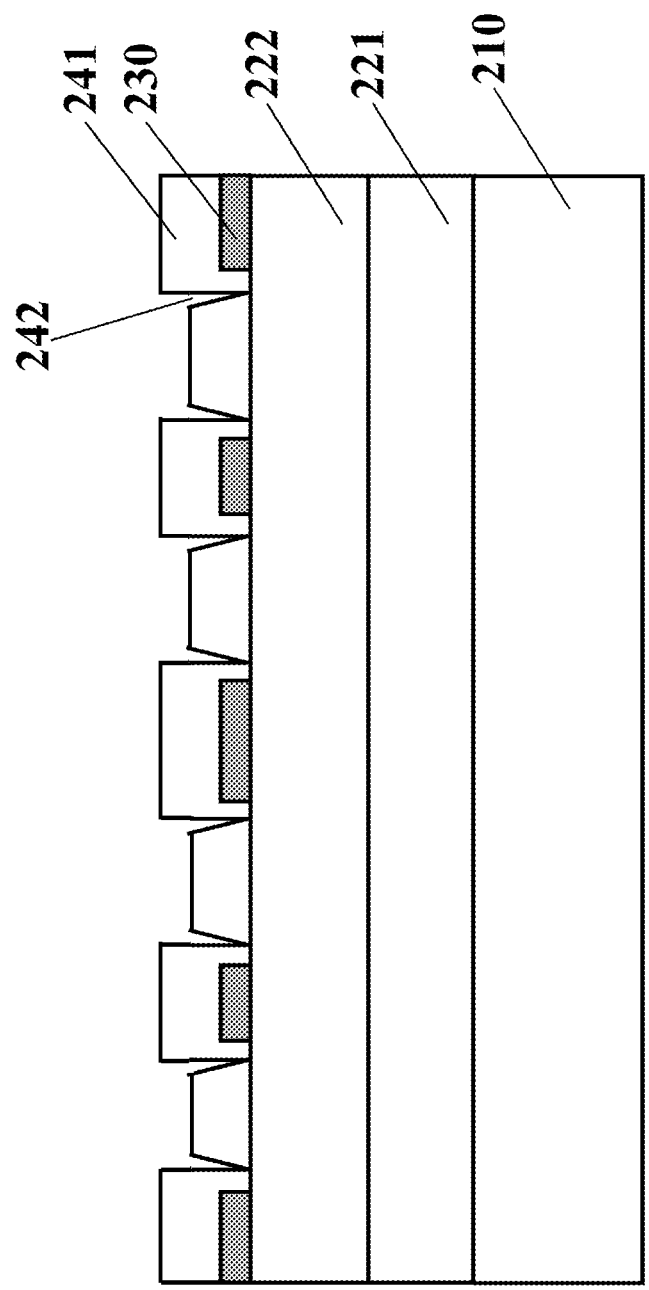
FIG. 7 illustrates a third step of fabricating the LED according to some embodiments of the present disclosure.
Figure 8:
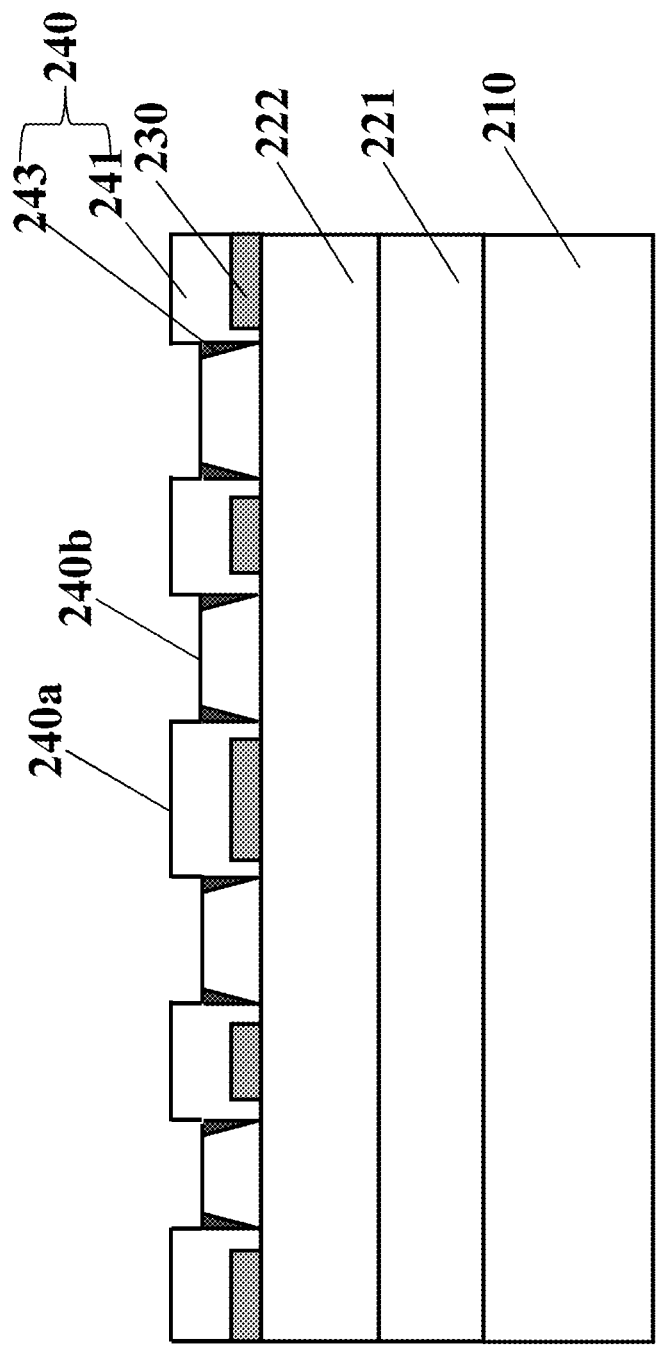
FIG. 8 illustrates a fourth step of fabricating the LED according to some embodiments of the present disclosure.

Further, in Step S300, forming a conducting layer 240 on the transparent dielectric layer 230. Referring to FIG. 4, the step is specifically divided into two steps: first, in step S310, having metal material vapored to form a physical plating layer 241 on the dielectric layer 230. Since the physical plating is anisotropic, only depositing in a vertical direction, cracks 242 are generated near the edge region of the dielectric layer 230, as shown in FIG. 7; in step S320, by means of chemical plating, forming a chemical plating layer 243 on the physical plating layer 241. And as the chemical plating layer is isotropic, the metal is deposited in various directions, so that the cracks 242 can be effectively filled, as shown in FIG. 8.

In this embodiment, with the combined method of the physical plating and the chemical plating, the cracks generated by the physical plating are filled by the chemical plating method, and the cross-sectional area of the conductive through-hole is increased after the cracks are filled with the metal, thereby increasing the current spreading area, making the current more evenly distributed over the conductive through-holes and preventing uneven current spreading due to cracks in individual conductive through-holes.

In this embodiment, the conducting layer may generally include a metal reflective layer, a metal bonding layer, or the like. The chemical plating layer 243 fills the cracks 242 in the physical plating layer 241, and also covers the upper surface of the physical plating layer 241 at a thickness of 0.3 to 5 μm. The conducting layer 240, filling the conductive through-holes 231 in the dielectric layer 230, finally forms an upper surface with a height difference structure, and 240a is the high surface and 240b the low surface.

Figure 9:
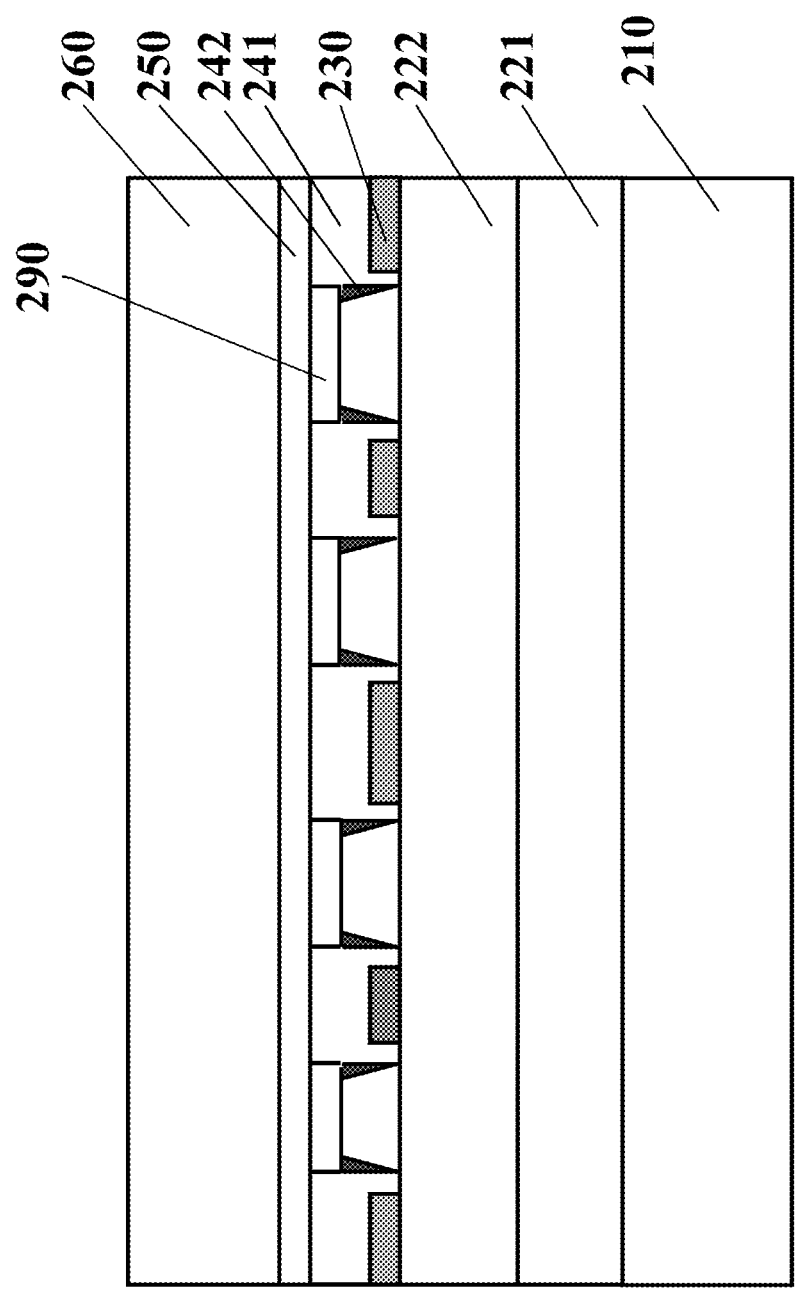
FIG. 9 illustrates a fifth step of fabricating the LED according to some embodiments of the present disclosure.

Next, in Step S400, providing a conductive submount 260, and forming a metal bonding layer 250 on the conductive submount 260, then bonding the conductive submount 260 to the conducting layer on the light emitting epitaxial laminated structure, as shown in FIG. 9. Since the surface of the side of the conducting layer 240 far from the light emitting epitaxial laminated layer has a height difference, a series of holes 290 are formed at a position corresponding to the conductive through-holes after the conducting layer is connected to the conductive submount 260, which directly function as a current blocking layer.

Figure 10:
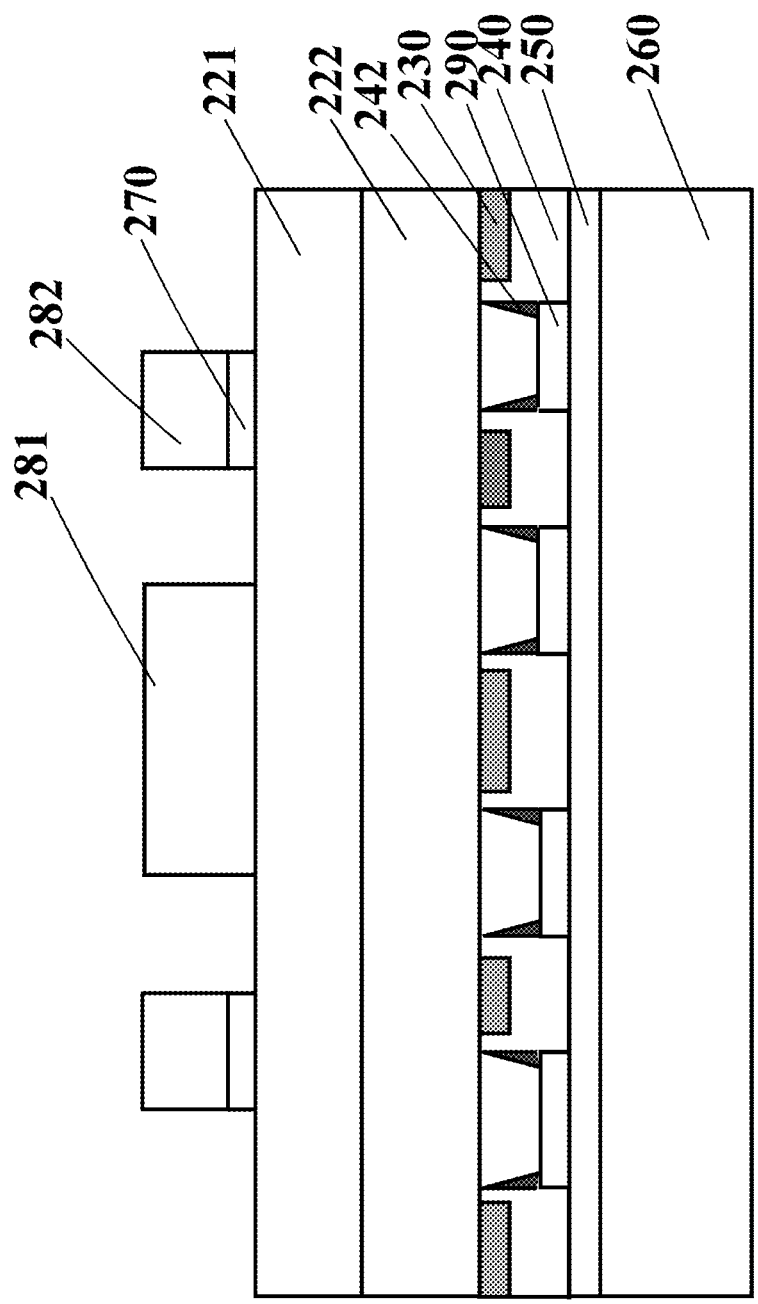
FIG. 10 is a sectional structural view of the light-emitting diode implemented according to some embodiments of the present disclosure.

Finally, removing the submount 210 and fabricating the electrodes, as shown in FIG. 10. In the present embodiment, the electrodes include a main electrode 281 and an extension electrode 282, and an Ohm contacting layer 270 may also be generally disposed under the extension electrode 282.

Figure 11:
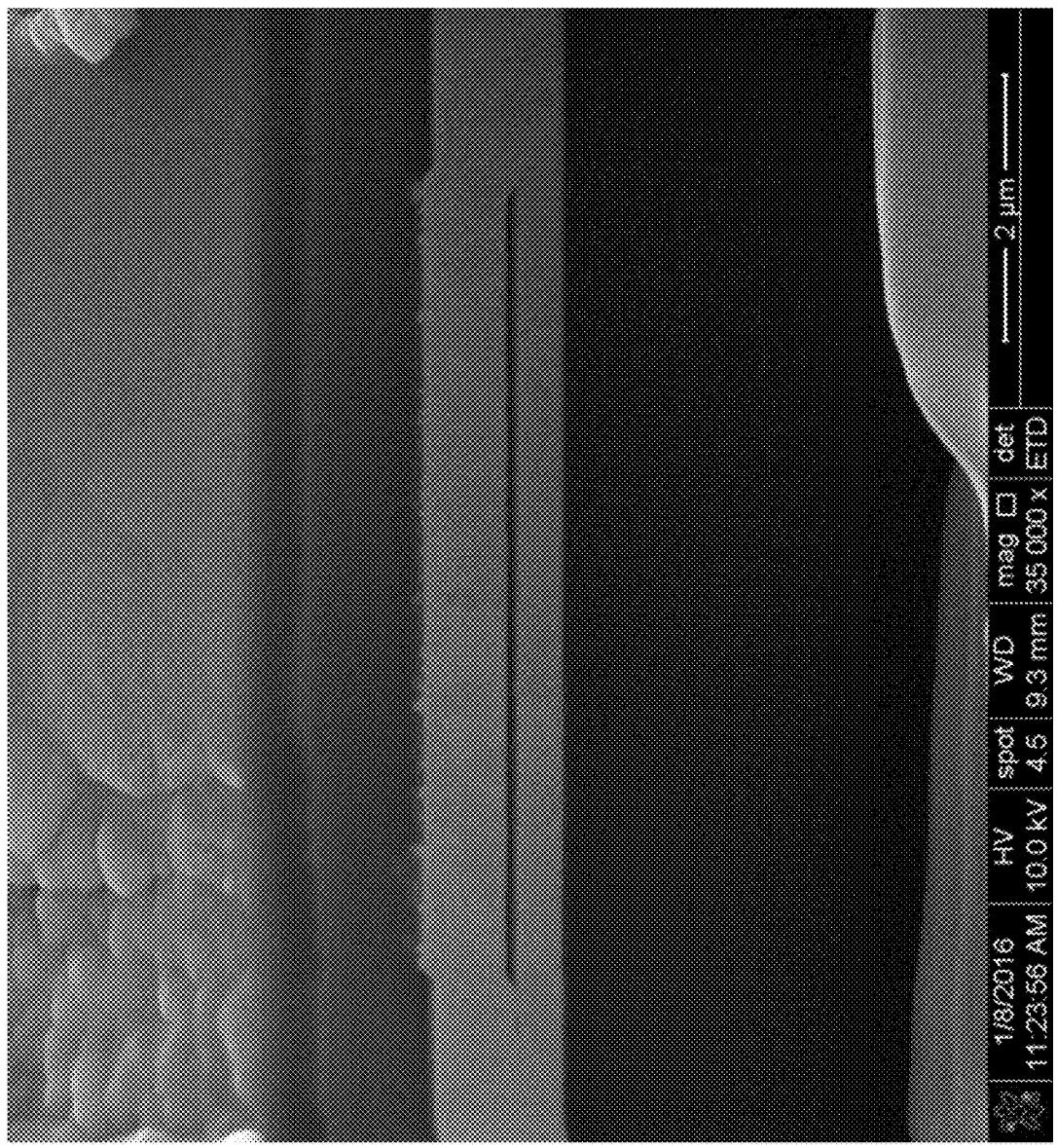
FIG. 11 is an SEM photograph of the light-emitting diode shown in FIG. 10.

FIG. 11 shows an SEM photograph of the light-emitting diode fabricated by the above method. As can be seen from the figure, the conducting layer 240 has no crack observed in the edge area corresponding to the hole, because the combined physical plating and chemical plating method has had the cracks filled with chemical plating, thereby avoiding the cracks on the vapored deposition of the physical plating.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode, comprising:
   a light emitting epitaxial structure including a first-type semiconductor layer, an active layer and a second-type semiconductor layer, and having a first surface as a light emitting surface, and an opposing second surface;
   a conducting layer formed over the second surface and including a physical plating layer and a chemical plating layer;
   a transparent insulating layer is arranged between the conducting layer and the light emitting epitaxial laminated structure and has a series of conductive through-holes, wherein the physical plating layer is adjacent to the light emitting epitaxial structure and has cracks formed during a vacuum evaporation process proximal to the conductive through-holes, and the chemical plating layer fills the cracks having structures resulting from the vacuum evaporation process in the physical plating layer; and
   a submount coupled to the light emitting epitaxial structure through the conducting layer.

2. The light-emitting diode of claim 1, wherein:
   the physical plating layer fills the conductive through-holes.

3. The light-emitting diode of claim 2, wherein:
   a surface of a side of the physical plating layer distal from the light emitting epitaxial structure has a height difference, thereby after the coupling to the submount, forming a series of holes at positions corresponding to the conductive through-holes, and serving as a current blocking layer.

4. The light-emitting diode of claim 2, wherein the cracks are formed at an edge position of the physical plating layer.

5. The light-emitting diode of claim 1, wherein a thickness of the chemical plating layer is 0.3-5 μm.

6. A method of fabricating the light-emitting diode of claim 1, the method comprising:
   1) providing the light emitting epitaxial structure including the first-type semiconductor layer, the active layer and the second-type semiconductor layer, having the first surface as the light emitting surface and the second surface opposing to the first surface;
   2) forming the conducting layer at the second surface of the light emitting epitaxial structure;
   3) providing the submount and coupling the submount to the light emitting epitaxial structure through the conducting layer;
   wherein the forming the conducting layer comprises:
   forming the physical plating layer at the second surface of the light emitting epitaxial structure by metal evaporation, with the cracks therein;
   depositing a metal material at the physical plating layer by chemical plating to form the chemical plating layer and fill the cracks having structures resulting from the vacuum evaporation process in the physical plating layer.

7. The method of claim 6, wherein prior to the forming the conducting layer, the transparent insulating layer is first formed at the second surface of the light emitting epitaxial structure and has the series of conductive through-holes filled by the physical plating layer.

8. The method of claim 7, wherein a surface of a side of the physical plating layer distal from the light emitting epitaxial structure has a height difference, thereby after the connection to the submount, forming a series of holes on the positions corresponding to the conductive through-holes, and serves as a current blocking layer.

9. The method of claim 7, wherein the cracks are formed on the edge position of the physical plating layer.

10. The method of claim 6, wherein a thickness of the chemical plating layer is 0.3-5 μm.

11. A light-emitting system for display, signage, or lighting comprising a plurality of light-emitting diodes (LEDs), each LED comprising:
   a light emitting epitaxial structure including a first-type semiconductor layer, an active layer and a second-type semiconductor layer, and having a first surface as a light emitting surface, and an opposing second surface;
   a conducting layer formed over the second surface and including a physical plating layer and a chemical plating layer;
   a transparent insulating layer is arranged between the conducting layer and the light emitting epitaxial laminated structure and has a series of conductive through-holes, wherein the physical plating layer is adjacent to the light emitting epitaxial structure and has cracks formed during a vacuum evaporation process proximal to the conductive through-holes, and the chemical plating layer fills the cracks having structures resulting from the vacuum evaporation process in the physical plating layer; and
   a submount coupled to the light emitting epitaxial laminated layer through the conducting layer.

12. The light-emitting system of claim 11, wherein:
   the physical plating layer fills the conductive through-holes.

13. The light-emitting system of claim 12, wherein:
   a surface of a side of the physical plating layer distal from the light emitting epitaxial structure has a height difference, thereby after the coupling to the submount, forming the series of holes at positions corresponding to the conductive through-holes, and serving as a current blocking layer.

14. The light-emitting system of claim 12, wherein the cracks are formed at an edge position of the physical plating layer.

15. The light-emitting system of claim 11, wherein a thickness of the chemical plating layer is 0.3-5 μm.

16. The light-emitting system of claim 11, wherein each LED is fabricated with a method comprising:

1) providing the light emitting epitaxial structure including the first-type semiconductor layer, the active layer and the second-type semiconductor layer, having the first surface as the light emitting surface and the second surface opposing to the first surface;
2) forming the conducting layer at the second surface of the light emitting epitaxial structure;
3) providing the submount and coupling the submount to the light emitting epitaxial structure through the conducting layer;

wherein the forming the conducting layer comprises:

the physical plating layer is formed at the second surface of the light emitting epitaxial structure by metal evaporation, with the cracks therein;

by chemical plating, the metal material is deposited at the physical plating layer and forms a chemical plating layer and fills the cracks having structures resulting from the vacuum evaporation process in the physical plating layer.

17. The light-emitting system of claim 16, wherein prior to the forming the conducting layer, a transparent insulating layer is first formed at the second surface of the light emitting epitaxial structure and has the series of conductive through-holes filled by the physical plating layer.

18. The light-emitting system of claim 7, wherein a surface of a side of the physical plating layer distal from the light emitting epitaxial structure has a height difference, thereby after the connection to the submount, forming a series of holes on the positions corresponding to the conductive through-holes, and serves as a current blocking layer.

19. The light-emitting system of claim 17, wherein the cracks are formed on the edge position of the physical plating layer.

20. The light-emitting system of claim 16, wherein a thickness of the chemical plating layer is 0.3-5 μm.

* * * * *